United States Patent
Wu et al.

(10) Patent No.: US 6,821,841 B1
(45) Date of Patent: Nov. 23, 2004

(54) METHOD FOR FABRICATING A MASK READ-ONLY-MEMORY WITH DIODE CELLS

(75) Inventors: Chun-Pei Wu, Nan-Tao (TW); Huei-Huarng Chen, Chang-Hua (TW); Wen-Bin Tsai, Tainan (TW); Hsuan-Ling Kao, Taipei (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 10/643,964

(22) Filed: Aug. 20, 2003

(51) Int. Cl.[7] .......................................... H01L 21/8242
(52) U.S. Cl. ...................... 438/243; 438/244; 438/248; 438/249; 438/259; 438/261
(58) Field of Search .................................. 438/241–244, 438/247–249, 257–259, 261–266

(56) References Cited

U.S. PATENT DOCUMENTS 6,689,658 B2 * 2/2004 Wu ............................ 438/257

* cited by examiner

Primary Examiner—Hsien Ming Lee

(57) ABSTRACT

A method for fabricating a mask read-only-memory with diode cells is provided. A doped conductive layer with a first conductivity is formed on bit lines. Then, a photoresist layer with a mask ROM pattern is formed on an interlayer dielectric layer on the doped conductive layer for serving as an etching mask, thereby forming openings in the interlayer dielectric layer unto the exposed regions of the doped conductive layer. Performing ion implantation to form a diffusion region with a second conductivity opposite to the first conductivity in each exposed region of the doped conductive layer, so that the doped conductive layer and the diffusion regions formed therein constitute diode cells that are served as memory cells. A contact plug is formed in each opening unto the diode cell and a conductive layer is formed on the contact plug for serving as word lines.

20 Claims, 4 Drawing Sheets

METHOD FOR FABRICATING A MASK READ-ONLY-MEMORY WITH DIODE CELLS

BACKGROUND OF THE INVENTION

1. Field of the Invention

The present invention relates to a method for fabricating a mask read-only-memory (mask ROM), and more particularly to a method for fabricating a mask ROM with diode cells.

2. Description of the Prior Art

Memory cells of a mask ROM (mask read-only-memory) are is generally made using channel transistors. Programming of the ROM is achieved by selectively implanting ions into the channels of these transistors. By implanting ions into the channel regions of specified transistors, threshold voltage of the devices changes. Hence, the "on" or "off " state of the memory cell is coded. A mask ROM cell is formed by laying a polysilicon word line (WL) over a bit line (BL), and the memory cell channel is formed in the region underneath the word line between neighboring bit lines. Normally, each ROM cell is in a logic state of "1" or "0" depending on whether ions are implanted into the channel region or not. The advantage of being able to program the state of each ROM cell by an ion implant operation is that semi-finished ROM products can be made. Once the required program codes arrive, a mask can be made and then the final ion implant operation can be carried out, thereby shortening customers' delivery date. However, the method requires the production of one more photomask to carry out an ion implant operation. Moreover, reliability of the final ROM product is very much dependent upon the quality of the ion implant operation.

FIG. 1A is a schematic top view of a conventional mask ROM. Referring to FIG. 1B, a gate oxide layer 102 is formed in a p-type substrate 100. Gates 104 are formed over the substrate 100 as word lines. An ion implantation process is performed by using gates 104 as masks to form n-type source/drain regions 106 as bit lines. The bit lines cross the word lines perpendicularly. Channels are formed below the word lines. The state of each memory cell is determined by the channels. The method of closing the channels is to implant p-type ions into specific channels 107 to form code ion implant regions 110.

The conventional method for fabricating the mask ROM is shown in FIGS. 1B and 1C. Referring to FIG. 1B, a p-type substrate 100 is provided. An isolation region 101 is formed in the substrate 100. A gate oxide layer 102 and gates 104 are formed in sequence on the substrate 100. An ion implantation process is performed by using n-type ions as dopants to form a plurality of source/drain regions 106 in the substrate 100. Channels 107 are formed between two adjacent source/drain regions 106.

Referring to FIG. 1C, a patterned photoresist layer 108 is formed over the substrate 100 to expose subsequently formed code ion implant regions. An ion implantation process is performed by using phosphrous-31 as a dopant. The implantation energy is 160 KeV and the dosage of the dopant is about $1 \times 10^{14}$ ions/cm². After performing an annealing process at 850° C., code ion implant regions 110 are formed. The photoresist layer 108 is removed. Thus, an encoding process of the mask ROM is completed.

The conventional mask ROM device uses a channel transistor as a memory cell. The implantation of ions into the channel determines the binary data "0 " or "1". However, when the mask ROM device is shrunk down, the issue of the code pattern resolution is enhanced and the code ion implanted region cannot be well defined.

Accordingly, it is an intention to provide an improved method for fabricating a mask ROM, which can overcome the above drawback encountered when the mask ROM device is increasingly shrunk down.

SUMMARY OF THE INVENTION

It is one objective of the present invention to provide a method for fabricating a mask read-only-memory with diode cells, which forms a structure of a contact plug/a PN diode instead of a channel transistor as a memory cell. The process for forming the structure of the contact plug/PN diode is simple and can provide a well-defined code area even though the device dimension is shrunk down.

It is another objective of the present invention to provide a method for fabricating a mask read-only-memory with diode cells, since the area of the substrate occupied by one PN diode cell is smaller than that of a channel transistor, a high-density mask ROM device can be obtained by the present method.

It is a further objective of the present invention to provide a method for fabricating a mask read-only-memory with diode cells, which provides a simple process to form a structure of a contact plug/a PN diode instead of a channel transistor as a memory cell. Therefore, the manufacturing cost can be reduced.

In order to achieve the above objectives, the present invention provides a method for fabricating a mask read-only-memory with diode cells. A semiconductor substrate is provided and a buried diffusion layer with a first conductivity is formed in the top portion of the semiconductor substrate. A plurality of shallow trench isolation regions are formed in the semiconductor substrate, and making the buried diffusion layer to a plurality of bit lines. An interlayer dielectric layer is formed over the buried diffusion layer and the shallow trench isolation regions. A photoresist layer with a mask read-only-memory code pattern is formed on the interlayer dielectric layer. Performing an anisotropic etching process to form openings in the interlayer dielectric layer unto the exposed regions of the buried diffusion layer using the photoresist layer as an etching mask. Then, the photoresist layer is removed. Performing ion implantation to form a diffusion region, with a second conductivity opposite to the first conductivity, in each of the exposed regions of the buried diffusion layer. Thereafter, a contact plug is formed in each opening unto the diffusion region. A conductive layer is formed on the interlayer dielectric layer for serving as word lines. As a consequence, a structure of a contact plug/a diode cell is obtained, which is used as a memory cell of a mask read-only-memory (mask ROM) instead of a channel transistor. The area of the semiconductor substrate occupied by one diode cell is smaller than that of the channel transistor. Thus, a high-density mask ROM device can be obtained by the present method. Furthermore, the process for forming the structure of the contact plug/diode cell is simple and can provide a well-defined code area even through the device dimension is shrunk down. The manufacturing cost is also reduced.

BRIEF DESCRIPTION OF THE DRAWINGS

The objectives and features of the present invention as well as advantages thereof will become apparent from the following detailed description, considered in conjunction with the accompanying drawings.

DESCRIPTION OF THE EMBODIMENTS

The present invention provides a method for fabricating a mask ROM with diode cells, which uses a structure of a contact plug/a PN diode instead of a channel transistor to serve as a memory cell. The process for forming the structure of the contact plug/PN diode is simple and can provide a well-defined code area even though the device dimension is shrunk down. The manufacturing cost is also reduced. Furthermore, the area of the semiconductor substrate occupied by one PN diode is smaller than that of the channel transistor. Thus, a high-density mask ROM device can be obtained by the present method.

The present method for fabricating a mask ROM with diode cells will be described in detail according to one preferred embodiment of the present invention with reference to the accompanying drawings.

Figure 1A:
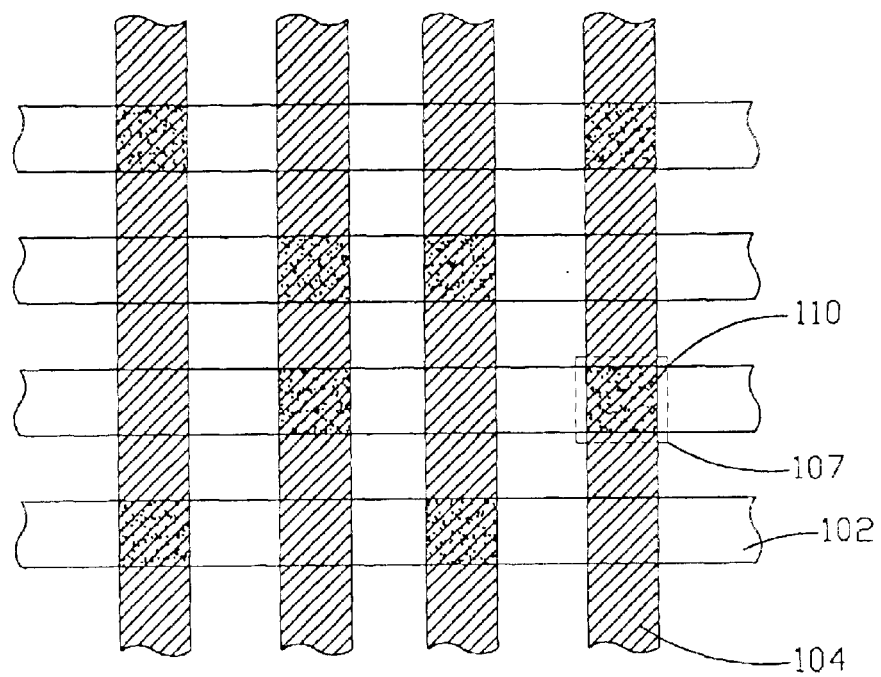
FIG. 1A is a schematic top view of a conventional mask ROM.
Figure 1B:
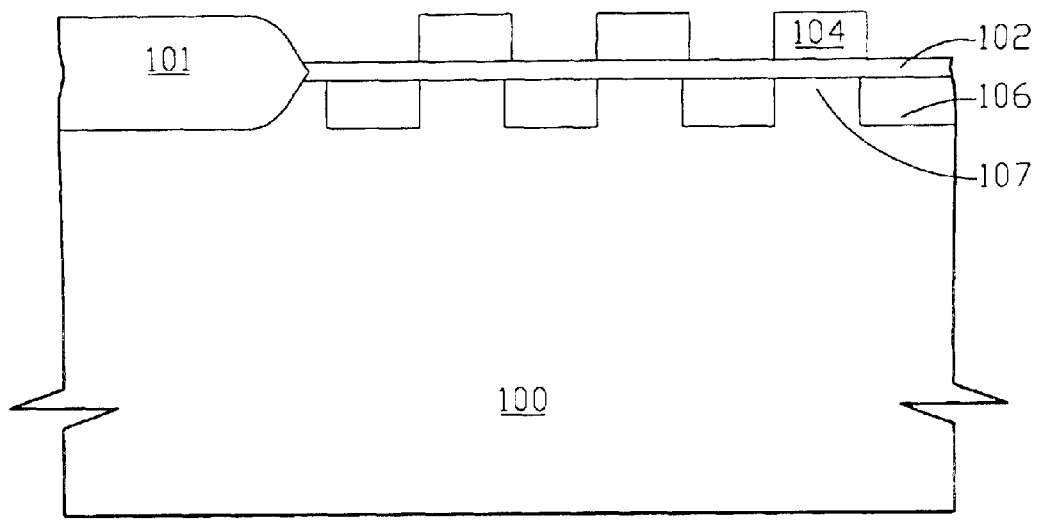
FIGS. 1B to 1C are schematic cross-sectional views of various steps for fabricating the conventional mask ROM including a coding process of the mask ROM.
Figure 1C:
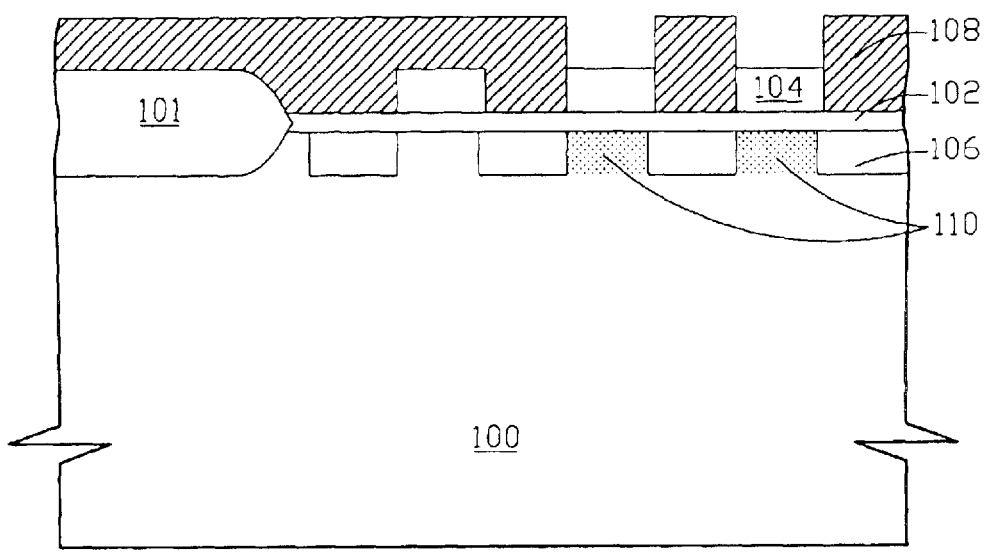
Figure 2A:
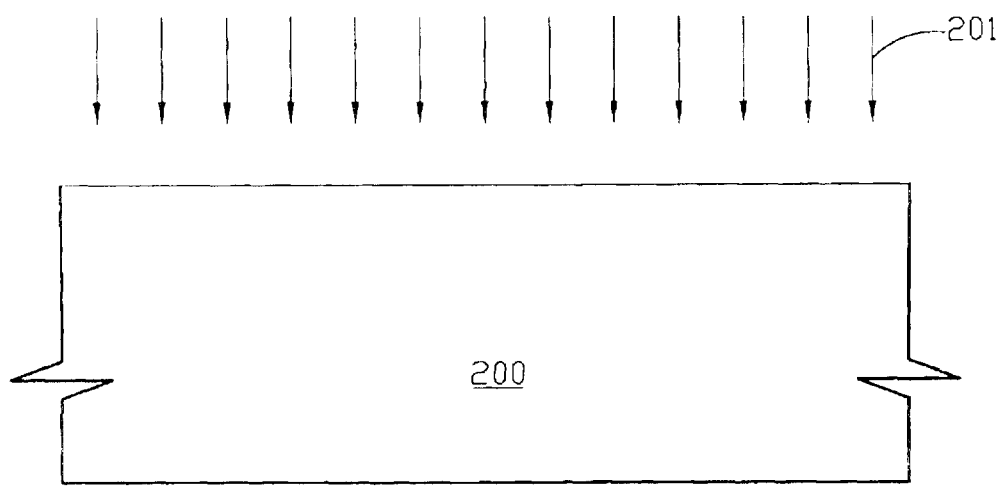
FIGS. 2A to 2E are schematic cross-sectional views of various steps for fabricating a mask ROM with diode cells according to one preferred embodiment of the present invention.
Figure 2B:
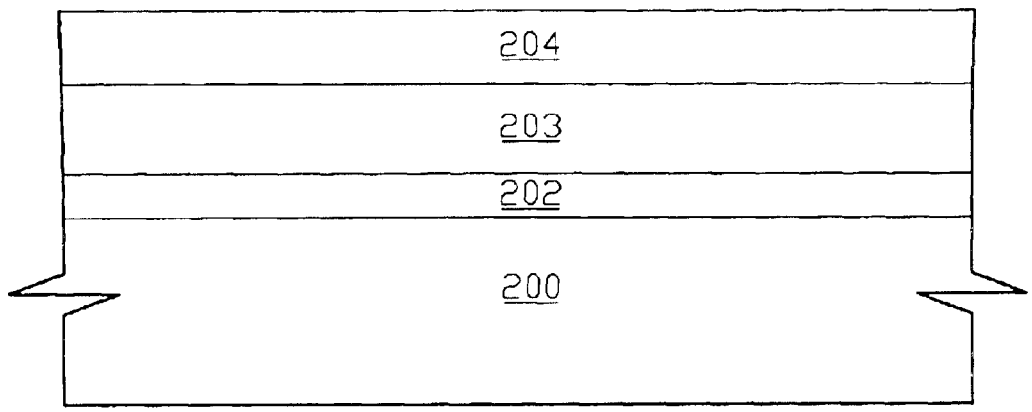

FIGS. 2A to 2E are schematic cross-sectional views of various steps for fabricating a mask ROM with diode cells according to one preferred embodiment of the present invention. Firstly, referring to FIG. 2A, a semiconductor substrate 200 is provided. The semiconductor substrate 200 can be silicon substrate, germanium substrate, germanium arsenic substrate and the like. Performing an ion implantation process 201 to form a buried diffusion layer 202 with a first conductivity in the top portion of the semiconductor substrate 200 to be served as bit lines. The first conductivity can be N type conductivity or P type conductivity. In the preferred embodiment, the buried diffusion layer 202 is a $N^+$ buried diffusion layer, as shown in FIG. 2A. Referring to FIG. 2B, then, a doped conductive layer 203 with the first conductivity is formed on the buried diffusion layer 202. The doped conductive layer 203 is preferably an $N^-$ doped polysilicon layer, which can be formed by an in-situ doped low pressure chemical vapor deposition (LPCVD) method with a reaction gas of $SiH_4$ and a dopant source of $PH_3$ at a temperature of about 600–650° C. and under a pressure of about 0.3–0.6 torr. Alternately, the $N^-$ doped polysilicon layer can be formed by a post-LPCVD thermal diffusion method at a temperature of about 900° C. to drive in dopant source, such as arsenic and $POCl_3$, to the polysilicon layer formed on the buried diffusion layer 202. Besides, the $N^-$ doped polysilicon layer can be formed by an ion implantation process with dopant source, such as phosphorus, arsenic, $PH_3$ and $AsH_3$, to implant the dopants in the polysilicon layer formed on the buried diffusion layer 202. Then, a silicon nitride layer 204 is formed on the doped conductive layer 203 for serving as a CMP (chemical mechanical polishing) stopping layer. The silicon nitride layer 204 can be formed by a low pressure chemical vapor deposition method with reaction gases of $SiH_2Cl_2$ and $NH_3$ at a temperature of about 700–800° C.

Figure 2C:
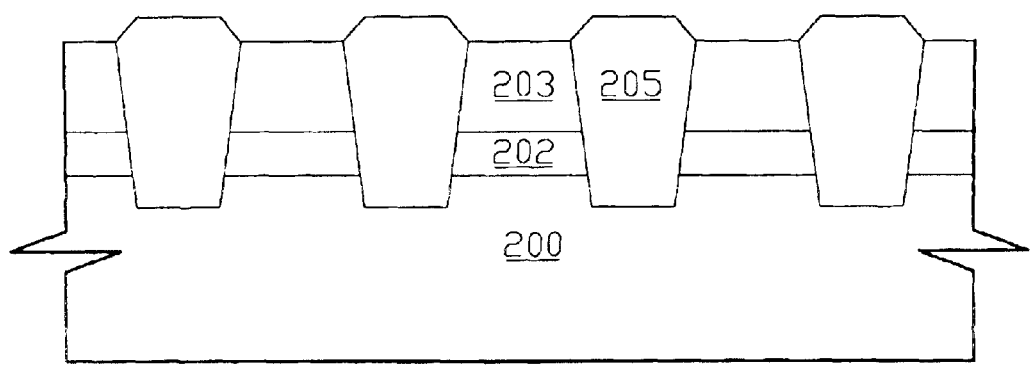

Referring to FIG. 2C, a plurality of trench regions is formed in the semiconductor substrate 200 by a conventional photolithography and etching method. Then, a silicon dioxide layer is deposited over the silicon nitride layer 204 to fill the trench regions. The silicon dioxide layer can be deposited by a low pressure chemical vapor deposition method with a reaction gas of TEOS (tetra-ethyl-ortho-silicate) at a temperature of about 650–850° C. and under a pressure of about 0.1–5 torr. Alternately, the silicon dioxide layer can be deposited by a plasma enhanced chemical vapor deposition method with a reaction gas of $SiH_4$ at a temperature of 300–400° C. and under a pressure of about 1–10 torr. Planarizing the silicon dioxide layer until the silicon nitride layer 204 by a chemical mechanical polishing method to form several shallow trench isolation regions 205 in the semiconductor substrate 200, and making the buried diffusion layer 202 to a plurality of bit lines. Then, the silicon nitride layer 204 is removed with a wet etching method utilizing hot $H_3PO_4$ aqueous solution.

Figure 2D:
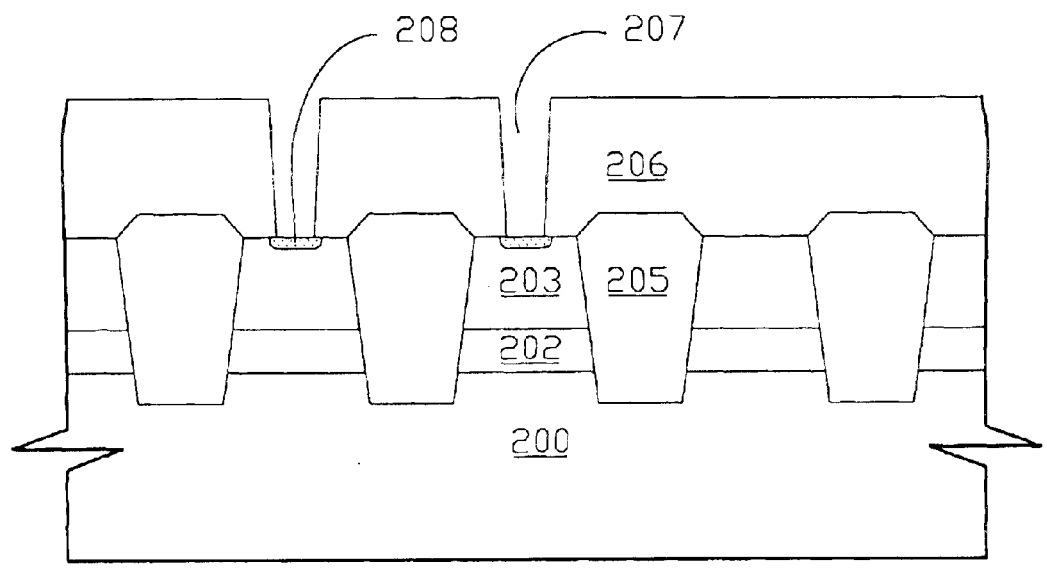

Referring to FIG. 2D, an interlayer dielectric layer 206 is formed over the shallow trench isolation regions 205. The interlayer dielectric layer 206 can be a silicon dioxide layer formed by the conventional chemical vapor deposition method, a BPSG (borophosphosilicate glass) layer formed by a plasma enhanced chemical vapor deposition method with reaction gases of TEOS (tetra-ethyl-ortho-silicate), $O_3$, TEB (triethyl-borate) and TMPO (tri-methyl-phosphate) at a temperature of about 400–500° C. and under a pressure of about 10 torr layer, a PSG (phosphosilicate glass) layer formed by a plasma enhanced chemical vapor deposition method with reaction gases of $SiH_4$, $N_2O$ and $PH_3$, a silicon nitride layer formed by a low pressure chemical vapor deposition method with reaction gases of $SiH_2Cl_2$ and $NH_3$ at a temperature of about 700–800° C., and a silicon oxynitride layer formed by a plasma enhanced chemical vapor deposition method with reaction gases of $SiH_4$, $N_2O$ and $N_2$. Next, a photoresist layer (not shown) is formed on the interlayer dielectric layer 206 and a photomask (not shown) with a mask ROM code pattern is placed on the photoresist layer to transfer the mask ROM code pattern to the photoresist layer. Thereafter, performing an anisotropic etching process using the photoresist layer as an etching mask to form openings 207 in the interlayer dielectric layer 206 unto the exposed regions of the doped conductive layer 203. Then, the photoresist layer is removed. Following, performing an ion implantation to form a diffusion region 208 with a second conductivity opposite to the first conductivity in each of the exposed regions of the doped conductive layer 203, each diffusion region 208 corresponding to a code area of the mask ROM. In the preferred embodiment, the diffusion region 208 is a $P^+$ diffusion region formed by an ion implantation with ion source, such as boron and $BF_2^+$. Thus, the $P^+$ diffusion region and the $N^-$ doped conductive layer 203/the $N^+$ buried diffusion layer 202 constitute a PN diode cell, which can instead of a channel transistor used in the conventional mask ROM, serving as a memory cell. Until now, the coding process of the mask ROM is completed.

Figure 2E:
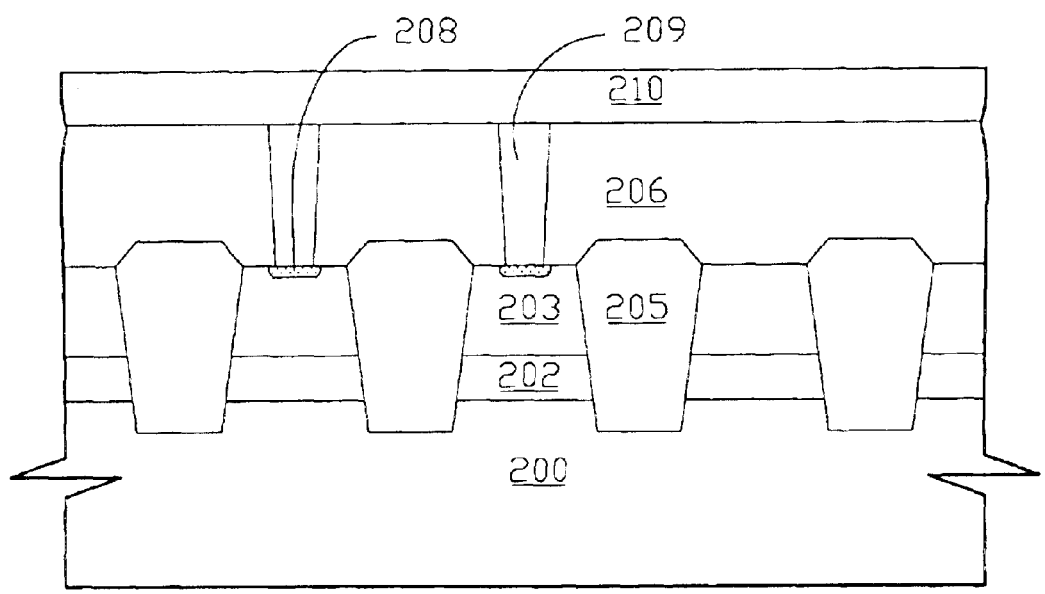

Referring to FIG. 2E, a contact plug 209 is then formed in each opening 207 and unto the exposed region of the doped conductive layer 203 to constitute a structure of a contact plug/a PN diode. The structure of the contact plug/PN diode is used to serve as a memory cell instead of a channel transistor used in the conventional mask ROM. The contact plug 209 can be a tungsten plug formed by a low pressure chemical vapor deposition method with reaction gases of $WF_6$ and $SiH_4$ at a temperature of about 300–550° C. and under a pressure of about 1–100 torr. A conductive layer 210 is then formed on the interlayer dielectric layer and the contact plug 209 to serve as word lines. The conductive layer 210 is preferably a polysilicon layer formed by a low pressure chemical vapor deposition method with a reaction gas of $SiH_4$ at a temperature of about 600–650° C.

In an alternative embodiment, the N⁻ doped conductive layer 203 can be omitted, and then forming the P⁺ diffusion region in the N⁺ buried diffusion layer 202 to constitute the PN diode cell instead of a channel transistor to serve as a memory cell.

The preferred embodiments are only used to illustrate the present invention, not intended to limit the scope thereof. Many modifications of the preferred embodiments can be made without departing from the spirit of the present invention.

What is claimed is:

1. A method for fabricating a mask read-only-memory with diode cells, comprising:

providing a semiconductor substrate;

forming a buried diffusion layer with a first conductivity in a top portion of said semiconductor substrate;

forming a plurality of shallow trench isolation regions in said semiconductor substrate and then making said buried diffusion layer to a plurality of bit lines;

forming an interlayer dielectric layer over said buried diffusion layer and said shallow trench isolation regions;

forming a photoresist layer with a mask read-only-memory code pattern on said interlayer dielectric layer;

performing an anisotropic etching process to form openings in said interlayer dielectric layer unto the exposed regions of said buried diffusion layer using said photoresist layer as an etching mask;

removing said photoresist layer;

performing ion implantation to form a diffusion region with a second conductivity opposite to said first conductivity in each of said exposed regions of said buried diffusion layer;

forming a contact plug in each said opening unto said diffusion region; and forming a conductive layer on said interlayer dielectric layer for serving as word lines.

2. The method of claim 1, wherein said semiconductor substrate is selected from a group consisting of silicon substrate, germanium substrate and germanium arsenic substrate.

3. The method of claim 1, wherein said first conductivity is either of N type conductivity and P type conductivity.

4. The method of claim 1, wherein said interlayer dielectric layer comprises silicon dioxide formed by a chemical vapor deposition method.

5. The method of claim 1, wherein said interlayer dielectric layer comprises PSG (phosphosilicate glass) formed by a plasma enhanced chemical vapor deposition method with reaction gases of $SiH_4$, $N_2O$ and $PH_3$.

6. The method of claim 1, wherein said interlayer dielectric layer comprises BPSG (borophosphosilicate glass) formed by a plasma enhanced chemical vapor deposition method with reaction gases of TEOS (tetra-ethyl-orthosilicate), $O_3$, TEB (tri-ethyl-borate) and TMPO (tri-methylphosphate) at a temperature of about 400~500° C. and under a pressure of about 10 torr.

7. The method of claim 1, wherein said interlayer dielectric layer comprises silicon nitride formed by a low pressure chemical vapor deposition method with reaction gases of $SiH_2Cl_2$ and $NH_3$ at a temperature of about 700~800° C.

8. The method of claim 1, wherein said interlayer dielectric layer comprises silicon oxynitride formed by a plasma enhanced chemical vapor deposition method with reaction gases of $SiH_4$, $N_2O$ and $N_2$.

9. The method of claim 1, wherein said contact plug comprises tungsten formed by a low pressure chemical vapor deposition method with reaction gases of $WF_6$ and $SiH_4$ at a temperature of about 300~550° C. and under a pressure of about 1~100 torr.

10. The method of claim 1, wherein said conductive layer comprises polysilicon formed by a low pressure chemical vapor deposition method with a reaction gas of $SiH_4$ at a temperature of about 600~650° C. and under a pressure of about 0.3~0.6 torr.

11. A method for fabricating a mask read-only-memory with diode cells, comprising:

providing a semiconductor substrate;

forming a buried diffusion layer with a first conductivity in top portion of said semiconductor substrate for serving as bit lines;

forming a doped conductive layer with said first conductivity on said buried diffusion layer, wherein the dopant concentration of said doped conductive layer is lighter than that of said buried diffusion region;

forming a plurality of shallow trench isolation regions in said semiconductor substrate;

forming an interlayer dielectric layer over said doped conductive layer and said shallow trench isolation regions;

forming a photoresist layer with a mask read-only-memory code pattern on said interlayer dielectric layer;

performing an anisotropic etching process to form openings in said interlayer dielectric layer unto the exposed regions of said doped conductive layer using said photoresist layer as an etching mask;

removing said photoresist layer;

performing ion implantation to form a diffusion region with a second conductivity opposite to said first conductivity in each of said exposed regions of said doped conductive layer;

forming a contact plug in each of said openings unto said diffusion region; and forming a conductive layer on said interlayer dielectric layer for serving as word lines.

12. The method of claim 11, wherein said first conductivity is either of N type conductivity and P type conductivity.

13. The method of claim 11, wherein said doped conductive layer comprises doped polysilicon formed by an in-situ doped low pressure chemical vapor deposition method with a reaction gas of $SiH_4$ and a dopant source of $PH_3$ at a temperature of about 600~650° C. and under a pressure of about 0.3~0.6 torr.

14. The method of claim 11, wherein said interlayer dielectric layer comprises silicon dioxide formed by a chemical vapor deposition method.

15. The method of claim 11, wherein said interlayer dielectric layer comprises PSG (phosphosilicate glass) formed by a plasma enhanced chemical vapor deposition method with reaction gases of $SiH_4$, $N_2O$ and $PH_3$.

16. The method of claim 11, wherein said interlayer dielectric layer comprises BPSG (borophosphosilicate glass) formed by a plasma enhanced chemical vapor deposition method with reaction gases of TEOS (tetra-ethyl-orthosilicate), $O_3$, TEB (tri-ethyl-borate) and TMPO (tri-methylphosphate) at a temperature of about 400~500° C. and under a pressure of about 10 torr.

17. The method of claim 11, wherein said interlayer dielectric layer comprises silicon nitride formed by a low pressure chemical vapor deposition method with reaction gases of $SiH_2Cl_2$ and $NH_3$ at a temperature of about 700~800° C.

18. The method of claim 11, wherein said interlayer dielectric layer comprises silicon oxynitride formed by a plasma enhanced chemical vapor deposition method with reaction gases of $SiH_4$, $N_2O$ and $N_2$.

19. The method of claim 11, wherein said contact plug comprises tungsten formed by a low pressure chemical vapor deposition method with reaction gases of $WF_6$ and $SiH_4$ at a temperature of about 300~550° C. a pressure of about 1~100 torr.

20. The method of claim 11, wherein said conductive layer comprises polysilicon formed by a low pressure chemical vapor deposition method with a reaction gas of SiH4 at a temperature of about 600–650° C. a pressure of about 0.3–0.6 torr.

* * * * *